United States Patent [19]
De Vries

[11] Patent Number: 6,073,152
[45] Date of Patent: Jun. 6, 2000

[54] METHOD AND APPARATUS FOR FILTERING SIGNALS USING A GAMMA DELAY LINE BASED ESTIMATION OF POWER SPECTRUM

[75] Inventor: Aalbert De Vries, Lawrenceville, N.J.

[73] Assignee: Sarnoff Corporation, Princeton, N.J.

[21] Appl. No.: 09/055,043

[22] Filed: Apr. 3, 1998

Related U.S. Application Data

[60] Provisional application No. 60/066,325, Nov. 21, 1997.

[51] Int. Cl.$^7$ ........................................ G06F 17/10
[52] U.S. Cl. ...................... 708/321; 708/300; 708/319
[58] Field of Search ................................ 708/321, 322, 708/319, 301, 300

[56] References Cited

U.S. PATENT DOCUMENTS

| | | | |
|---|---|---|---|
| 3,824,384 | 7/1974 | Murata et al. | 235/156 |
| 3,881,097 | 4/1975 | Lehmann et al. | 235/156 |
| 4,207,624 | 6/1980 | Dentino et al. | 708/321 |
| 5,301,135 | 4/1994 | Principe et al. | 364/724.17 |
| 5,327,366 | 7/1994 | Mav | 708/321 |
| 5,659,622 | 8/1997 | Ashley | 381/94 |

OTHER PUBLICATIONS

P. Sovka, P. Pollak, "The Study of Speech/Pause Detectors for Speech Enhancement Methods", EuroSpeech 97 Conference, 5th European Conference on Speech Communication and Technology, Rhodes, Greece Sep. 22–Sep. 25, 1997.

S. Van Gerven, F. Xie, "A Comparative Study of Speech Detection Methods", EuroSpeech 95 Conference, 4th European Conference on Speech Communication and Technology, Madrid, Spain Sep. 18–Sep. 21, 1995.

*Primary Examiner*—David H. Malzahn
*Attorney, Agent, or Firm*—William J. Burke

[57] ABSTRACT

A signal processing system for generating a signal component reduced output signal by estimating the power spectrum of a non-stationary signal component within a non-stationary input signal is disclosed. The estimated power spectrum of the signal component is determined by using a gamma delay line (GDL) filter. The weights of the GDL filter are adaptively updated in accordance with a detection method that is designed to detect the presence of the non-stationary signal component. By subtracting the estimated power spectrum of the signal component from the power spectrum of the entire input signal, a signal component reduced output signal can be generated.

26 Claims, 4 Drawing Sheets

METHOD AND APPARATUS FOR FILTERING SIGNALS USING A GAMMA DELAY LINE BASED ESTIMATION OF POWER SPECTRUM

This application claims the benefit of U.S. Provisional Application No. 60/066,325 filed Nov. 21, 1997, which is herein incorporated by reference.

The present invention generally relates to an apparatus and a concomitant method for processing a signal having two or more signal components. More particularly, the present invention estimates the power spectrum (or variances) of the signal components over time, which are, in turn, used to further process the signal components, e.g., separation or suppression of one or more of the signal components.

BACKGROUND OF THE DISCLOSURE

In real world environments, many observed signals are typically composites of a plurality of signal components. For example, if one records an audio signal within a moving vehicle, the measured audio signal may comprise a plurality of signal components, such as audio signals attributed to the tires rolling on the surface of the road, the sound of wind, sounds from other vehicles, speech signals of people within the vehicle and the like. Furthermore, the measured audio signal is non-stationary, since the signal components vary in time as the vehicle is traveling.

The processing of signals can be implemented to achieve various desired results such as echo cancellation in telecommunications and signal noise reduction. More specifically, the variance matrix (or co-variance matrix) of observed signals discloses important information about these signals such as power spectrum, linear prediction coefficients (LPC), and the like. Thus, an important task in signal processing is the ability to accurately estimate the variance (or co-variance) matrix of the signals or processes. However, for non-stationary signals, such as speech, the estimated variances change over time and must be continually updated to reflect the most recent information. Typically, filters can be employed to estimate variances of signals.

One filtering method is the tapped delay line (TDL), which employs a series of unit delay elements connected so that the first delay element delays the input signal by one time unit, the second delay element delays the input signal by another time unit, and so on. A copy of the output of each delay element is tapped out and multiplied by a predetermined weighting factor. The weighting factor serves to attenuate or increase the value of a particular sample within the signal. The weighted outputs from all of the delay elements are serially added using summation elements. The output of the last summation element in the series is the output of the filter.

However, TDL is computationally expensive since the entire filtering process is repeated for each new sample in the signal. Furthermore, TDL has a fixed memory depth, i.e., limited to a memory depth equal to the number of delay elements. Thus, TDL may be impractical for signal processing, where the memory depth needs to be adjusted over time.

A second filtering method is the "leaky integrator" (LI) method which is a recursive filter that also utilizes a delay element. However, LI feeds back a copy of the output from the delay element, multiplied by a predetermined feedback parameter (otherwise known as a forgetting factor), to the input of the delay element. The LI filter is computationally less expensive than TDL, since the LI filter produces an output that is based in part on an output performed for the previous input vector. Thus, the LI does not incur a large expense in performing numerous summation and multiplication steps. However, the LI filter lacks the resolution of the TDL filter, since there is no mechanism to individually alter the significance (e.g., adaptively apply different weights) of individual sample once that sample has been processed. Namely, the LI filter employs exponential decay weighting instead of individual sample weighting.

Recently, the filtering method of Gamma Delay Line (GDL) was introduced in U.S. Pat. No. 5,301,135, issued on Apr. 5, 1994, which is herein incorporated by reference in its entirety. The GDL is a tapped delay line of leaky integrators, thereby combining advantageous features of both the TDL and LI methods.

Therefore, a need exists in the art for adapting a GDL filter for signal processing of a non-stationary signal.

SUMMARY OF THE INVENTION

The present signal processing system generates a signal component reduced output signal by efficiently estimating the power spectrum (or co-variance) of a non-stationary signal component within a non-stationary input signal. Namely, the present invention is able to subtract the estimated power spectrum of a non-stationary signal component from the power spectrum of the entire input signal to quickly generate a signal component reduced output signal.

An important aspect of the present invention is the accurate estimation of the power spectrum of the signal component through the use a GDL filter. Unlike traditional GDL filters, the weights of the present GDL filter are adaptively updated in accordance with a detection method that is designed to detect the presence of the non-stationary signal component. In sum, since the GDL filter incorporates two adjustment parameters or weights ($\mu$, w), the filter allows individual tuning of the resolution and memory depth of the filter. This unique feature is well suited for estimating accurately and rapidly the power spectrum of a non-stationary signal component. In turn, by simply subtracting the estimated power spectrum of the signal component from the power spectrum of the entire input signal, a signal component reduced output signal can be generated, e.g., a noise reduced speech output signal.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
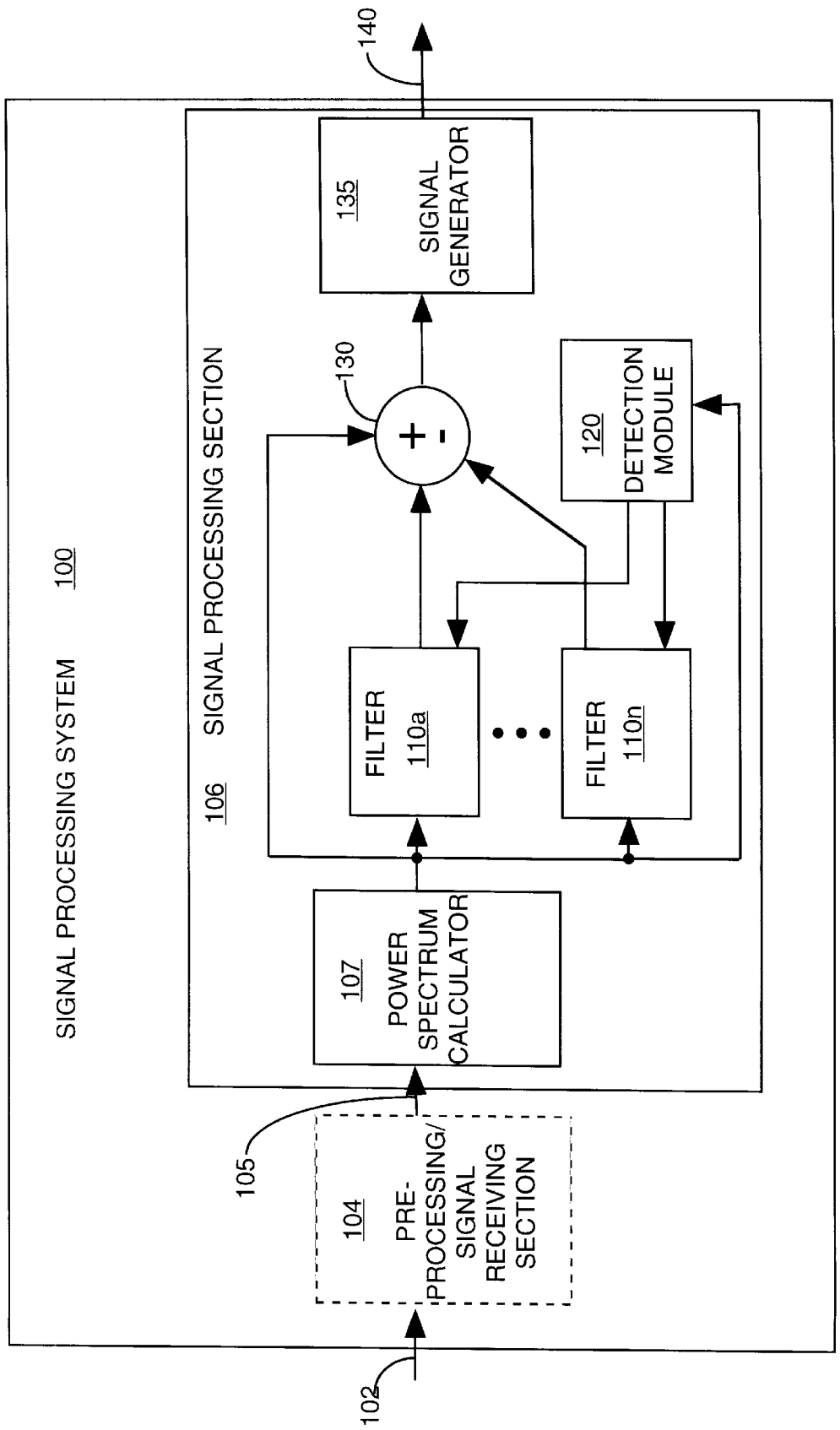
FIG. 1 depicts a block diagram of a signal processing system of the present invention.

FIG. 1 depicts a block diagram of a signal processing system 100 of the present invention. The signal processing system 100 consists of an optional signal pre-processing/receiving section 104 and a signal processing section 106.

More specifically, signal pre-processing section 104 serves to receive non-stationary signals on path 102, such as speech signals, financial data signals, or geological signals. Pre-processing section 104 may comprise a number of devices such as a modem, an analog-to-digital converter, a microphone, a recorder, a storage device such as a random access memory, a magnetic or optical drive and the like. Namely, pre-processing section 104 is tasked with the reception and conversion of a non-stationary input signal into a discrete signal, which is then forwarded to signal processing section 106 for further processing. As such, depending on the non-stationary signals that are being processed, pre-processing section 104 may comprise one or more components that are necessary to receive and convert the input signal into a proper discrete form. If the input signal is already in the proper discrete format, e.g., retrieving a stored discrete signal from a storage device, then pre-processing section 104 can be omitted altogether.

The discrete non-stationary signal on path 105 is received by power spectrum calculator 107 which generates a power spectrum of the non-stationary input signal. The power spectrum of the input signal can be represented in different manners, e.g., by squaring a Fourier transformation of the input signal. Since the input signal is organized into a plurality of audio frames, power spectrum calculator 107 will generate a power spectrum $P_x(t)$ for each of the audio frames, e.g., $P_x(t)$, $P_x(t-1)$, $P_x(t-2)$ and so on.

The signal processing section 106 then applies one or more filters 110a–110n to the power spectrum $P_x(t)$. In the preferred embodiment, the filters 110a–110n are GDL filters having outputs that are representative of estimated power spectrums of the signal components of the input signal. Namely, the output of each GDL filter is an estimate of the power spectrum for the current audio frame of a particular signal component. A detailed description of the GDL filter is provided below with reference to FIG. 2. The outputs from the filters 110a–110n are then fed into a summer/subtractor 130, which is employed to separate or suppress (add or subtract) one or more power spectrums of the signal components from the power spectrum of the input signal. The remaining power spectrum signal having one or more signal components removed or suppressed is then received by signal generator 135, which converts the remaining power spectrum signal into a "signal component reduced output signal" on path 140. Namely, the process of generating the power spectrum is reversed to obtain the output signal. If the suppressed signal component is considered to be noise, then the output signal of path 140 is a noise reduced output signal.

Furthermore, signal processing section 106 incorporates a detection module 120, which is coupled to the filters 110a–110n. The detection module 120 serves to detect or estimate the presence of a particular signal component in the present portion of the input signal. This "presence" information is employed by each GDL filter in its estimation of the power spectrum for a particular signal component. A detailed discussion on the application of the "presence" information is provided below.

In the preferred embodiment, the signal processing system 100 is employed as a speech enhancement system. More specifically, a measured speech signal is processed to remove or suppress a signal component within the speech signal that is representative of a "noise".

For example, a measured audio signal within a moving vehicle may comprise a speech signal of a human speaker and other signal components that are broadly grouped as "noise". A desirable feature would be the suppression of the "noise" in the audio signal to produce a clear speech signal of the speaker. The isolated speech signal of the speaker can then be transmitted as a voice signal in telecommunication applications or used to activate a voice command or speech recognition system, e.g., systems that automatically dial a cellular phone upon voice commands. Although the present invention is applied to a speech enhancement application, it should be understood that the present invention can be adapted to process other non-stationary signals.

The present speech enhancement system is premised on the fact that a measured input signal "x" is a composite of at least two signal components, e.g., "s" and "n", which can be expressed as:

$$x = s + n \tag{1}$$

where s is a speech signal component and n is a noise signal component. If s and n are uncorrelated, then it is then assumed that:

$$P_x = P_s + P_n \tag{2}$$

where $P_x$ is a power spectrum of the signal x; $P_s$ is a power spectrum of the signal s; and $P_n$ is a power spectrum of the signal n. The power spectrum of an input signal can be represented in different manners, e.g., by squaring a Fourier transformation of the input signal (e.g., $P_x = (\text{fft } x(t))^2$. Alternatively, the power spectrum of an input signal can be determined by performing the auto-correlation on the input signal (as illustrated below) and then applying a Fourier transformation. Thus, the present invention is not limited by the method in which the power spectrum is derived or the form in which the power spectrum is represented. Thus, if an estimate of $P_n$ can be obtained, then an estimate of $P_s$ can be expressed as:

$$\hat{P}_s = P_x - \hat{P}_n \tag{3}$$

Namely, the present invention computes an estimate $\hat{P}_n$, which is, in turn, subtracted from the power spectrum $P_x$ of the measured signal to produce an estimate $\hat{P}_s$. The estimate $\hat{P}_s$ is then used to generate a noise reduced speech signal. However, since the measured signal x and its signal components s and n are non-stationary, i.e., the speech signal and the noise are constantly changing over time, the estimation method must be adaptively updated to generate an accurate estimate $\hat{P}_n$.

In operation, a measured audio signal is divided into a plurality of audio frames, where each frame is approximately 10–30 msec. in duration. In the preferred embodiment, a duration is selected at 20 msec., since it is generally accepted that a speech signal is stationary within a 20 msec. interval. Using a sampling rate of 8 kHz, each audio frame will thus contain 160 samples, e.g., t=1 . . . N, where N is 160. Thus, the co-variance matrix (a generalized power spectrum representation) can be expressed as:

$$\begin{bmatrix} x(t) \\ x(t-1) \\ \vdots \\ x(t-N) \end{bmatrix} [x(t) \cdots x(t-N)] = \begin{bmatrix} x(t)x(t) & \cdots & x(t)x(t-N) \\ \vdots & \ddots & \\ x(t-N)x(t) & & x(t-N)x(t-N) \end{bmatrix} \tag{4}$$

By applying Fourier transform to the co-variance matrix, e.g., to any column (vector) in the co-variance matrix (i.e., the auto-correlation of the vector signal), the power spectrum of signal x can be determined. A power spectrum $P_x(t)$ is computed for each of the audio frames, which are then received and filtered by a GDL filter. It should be understood that other sampling frequencies and frame durations can be selected in accordance with different applications.

Figure 2:
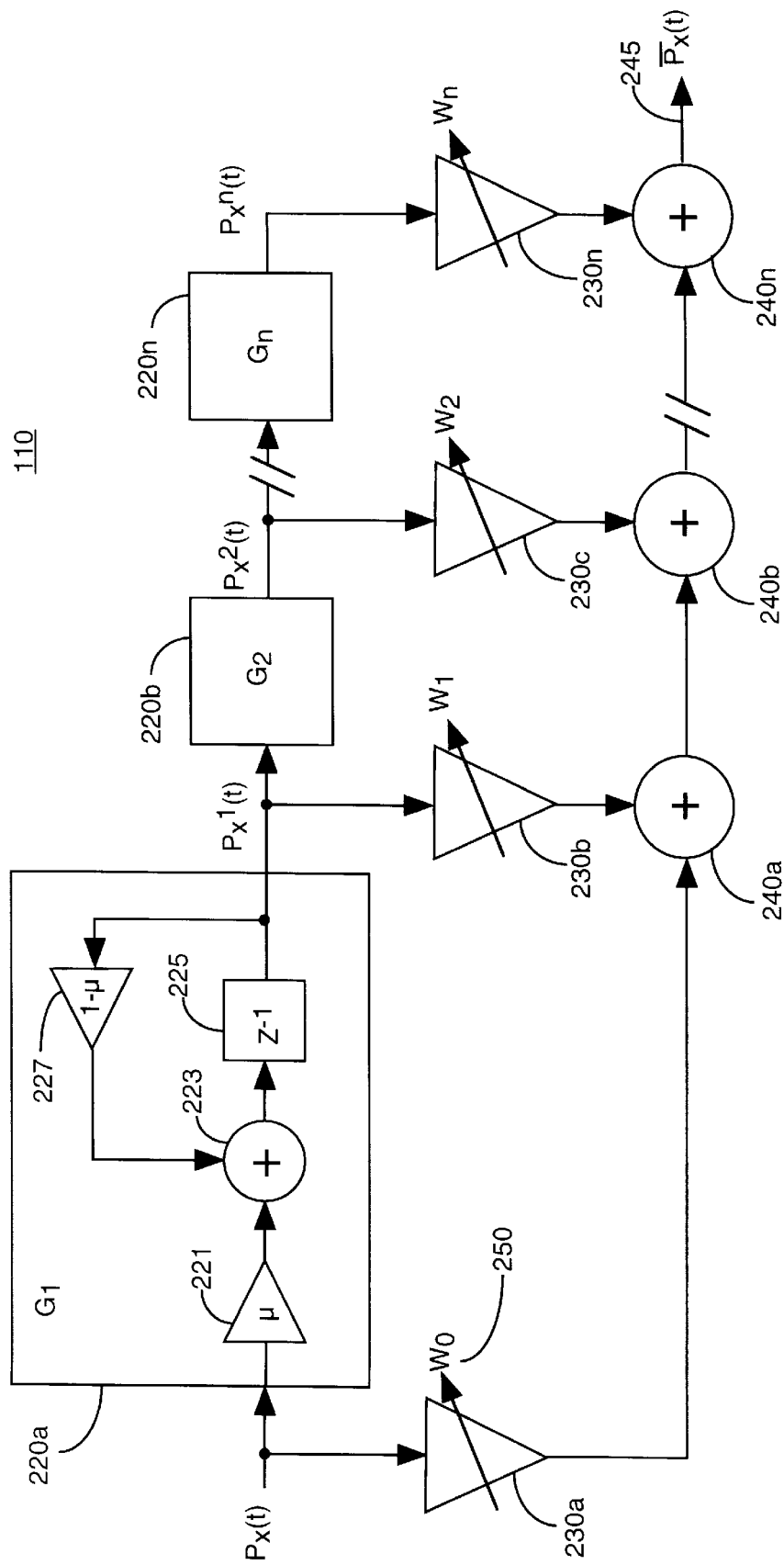
FIG. 2 depicts a block diagram of a GDL filter of the present invention.

FIG. 2 illustrates a block diagram of a GDL filter 110 that is employed to adaptively estimate a power spectrum $\overline{P}_x(t)$ from an input signal power spectrum $P_x(t)$. More specifically, in the preferred embodiment, $\overline{P}_x(t)$ is an estimated power spectrum of a noise signal component in the non-stationary input signal.

The adaptive GDL filter 110 receives a discrete input signal $P_x(t)$, and generates a discrete output signal $\overline{P}_x(t)$. The GDL filter 110 comprises a plurality of delay cells 220a–n connected in a linear cascade. Each delay cell 220 is a delay means, such as described in more detail below, of which the first cell 220a processes the input $P_x(t)$, and of which the subsequent cells $G_i$ have as an input the output of the previous cell $G_{i-1}$ in sequence. The input $P_x(t)$ is also multiplied in a multiplier 230a by an adaptive weighting factor $W_0$ 250. Similarly, the outputs of each of the cells 220a–n are each multiplied in multiplier 230b–n by an associated adaptive weighting factor $W_{1-n}$ (first weights) respectively. The outputs of all of the multipliers 230a–n are added together by a plurality of summers 240a–240n, with the resultant signal constituting the adaptive filter output signal $\overline{P}_x(t)$ on path 245. The function performed by the GDL filter 110 can be expressed as:

$$P_x^0(t) = P_x(t), k = 0 \quad (5)$$

$$P_x^k(t) = \mu P_x^{k-1}(t-1) + (1-\mu) P_x^k(t-1), k = 1, \ldots, n$$

$$\overline{P}_x(t) = \sum_{k=0}^{n} W_k P_x^k(t)$$

Although the present embodiment illustrates a plurality of multipliers and summers, it should be understood that the present invention is not so limited. Namely, the functions performed by these multipliers and summers can be implemented in a different fashion, e.g., employing a multiplexer to minimize the quantity of multipliers and summers.

Returning to FIG. 2, each delay cell 220 contains a unit delay element 225, multipliers 221 and 227, and summer 223. In operation, multiplier 221 multiplies the input to each delay cell by an adaptive parameter or weight $\mu$, where another multiplier 227 multiplies the output of the delay element 225 by an adaptive parameter equal in value to 1-$\mu$ to provide an adaptive feedback signal. The output signals of the multipliers 221 and 227 are added together in summer 223 to provide the signal input to the delay element 225.

The parameter $\mu$ (second weights) can be set to be a predefined value. Alternatively, $\mu$ can be based on the memory depth of the GDL filter. More specifically, $\mu$ can be expressed as:

$$\text{memory depth} = 1/\mu \quad (6)$$

For example, if each audio frame is selected to be 20 msec. and the period of "stationarity" of the signal component is selected to be one second, then there are 50 audio frames in the period of stationarity of the signal component. If the memory depth of the GDL filter is selected to match the period of stationarity of the signal component, then the memory depth is set to 50, thereby setting $\mu$ to a value of 0.02. It should be understood that other methods of setting $\mu$ can be employed with the present invention.

In the preferred embodiment, the weights $W_{0-n}$ 250 are adaptive updated by the detection module 120. More specifically, the detection module determines whether a particular audio frame should be weighted more significantly or less significantly. A general representation of this weighting method as applied to the calculation of $\overline{P}_x(t)$ can be expressed as:

$$\overline{P}_x(t) = \sum_{k=0}^{n} W_k P_x^k(t) \quad (7)$$

where $w_k$ is assigned in accordance with the probability of the presence of only the signal component, e.g., a noise signal component.

Thus, since the GDL filter incorporates two adjustment parameters or weights ($\mu$, w), the filter allows individual tuning of the resolution and memory depth of the filter. Namely, the memory depth or taps ($G_n$) of the GDL filter can be controlled by the proper selection of w, and the resolution or "distance" between the taps ($G_n$) can be controlled by the proper selection of $\mu$.

To illustrate the present invention, an audio frame within the measured audio signal may contain the noise signal component only (a noise only frame) or a combination of the speech signal component of the human speaker and the noise signal component (a noise and speech frame). It is generally assumed in this particular application that if a speaker is silent in a moving vehicle, then the measured audio signal should reflect only the noise signal component. Using this assumption, the detection module 120 will assign a higher weight to an audio frame (e.g., selectively changing W in the GDL filter) that has a high probability of containing only the noise signal component. Conversely, the detection module 120 will assign a lower weight to an audio frame that has a high probability of containing both the noise signal component and the speech signal component. The result from this method of weighting is an estimated power spectrum of the noise signal component, which can then be subtracted from the overall power spectrum of the measured input signal x. The remaining power spectrum must then be the power spectrum of the speech signal component, which is used to derive a noise reduced speech signal.

In the preferred embodiment, the method for detecting the presence of a "noise only frame" is also based on a measure of the power spectrum of the audio frames. More specifically, it has been observed that when the power spectrum of a particular audio frame is greater than two to three times the average measured power spectrum, then speech has commenced. In other words, if the power spectrum of a particular audio frame is greater than a predefined threshold, then the audio frame is deemed to contain both speech and noise signal components. In the present example, such audio frame will be assigned a small weight to reduce the frame's contribution in the estimation of the power spectrum of the noise component.

Conversely, if the power spectrum of a particular audio frame is not greater than two to three times the average measured power spectrum, then speech has not commenced. Such audio frame will be assigned a large weight to increase the frame's contribution in the estimation of the power spectrum of the noise component. Although the present invention employs a simple and efficient power spectrum based detection method, other detection methods can be used in the present invention as a mechanism to adaptively modify the weights 250 of the GDL filter 110. For example, other detection methods are disclosed by Stefaan Van Gerven et al. in "A Comparative Study of Speech Detection Methods" and by Pavel Sovka et al. in "The Study of Speech/Pause Detectors For Speech Enhancement Methods".

In the preferred embodiment, the weights 250 may take a value of "0" and "1". Thus, if an audio frame is deemed to be insignificant, then the audio frame is simply not considered, by applying a weight of zero. However, the present invention is not so limited. The weights can be refined as required for a particular application, e.g., the weights may take fractional values, as applicable.

For example, a more complex detection method can be designed to detect or distinguish more than two signal conditions, e.g., the detection of a frame with partial speech or the detection of a male voice versus a female voice and so on. Thus, FIG. 1 illustrates multiple GDL filters 110a–n, where each filter can be designed to estimate a power spectrum of a particular signal component within the input signal. The weights in each filter will be adaptively updated in accordance with its own detection criteria or thresholds as dictated by the detection module 120. In turn, a range of weight values can be defined to accommodate any number of signal conditions.

Furthermore, it is generally assumed that the memory depth of the present GDL filter is set at a depth to be no longer than the period of "stationarity" of the signal component that is having its power spectrum estimated. In other words, in order for the power spectrum to be an accurate representation of the signal component, it is generally assumed that the memory depth of the filter is correlated with the average signal change rate. For example, if the signal component represents noise, then the memory depth of the GDL filter can be set at a depth where the observed noise is relatively stationary, which in many cases, may be over a long period of time. In contrast, if the signal component to be removed represents speech, e.g., speech of a particular person in the composite audio signal, then the memory depth of the GDL filter should be set at a memory depth where the speech is relatively stationary, which in many cases, is a short period of time.

Figure 3:
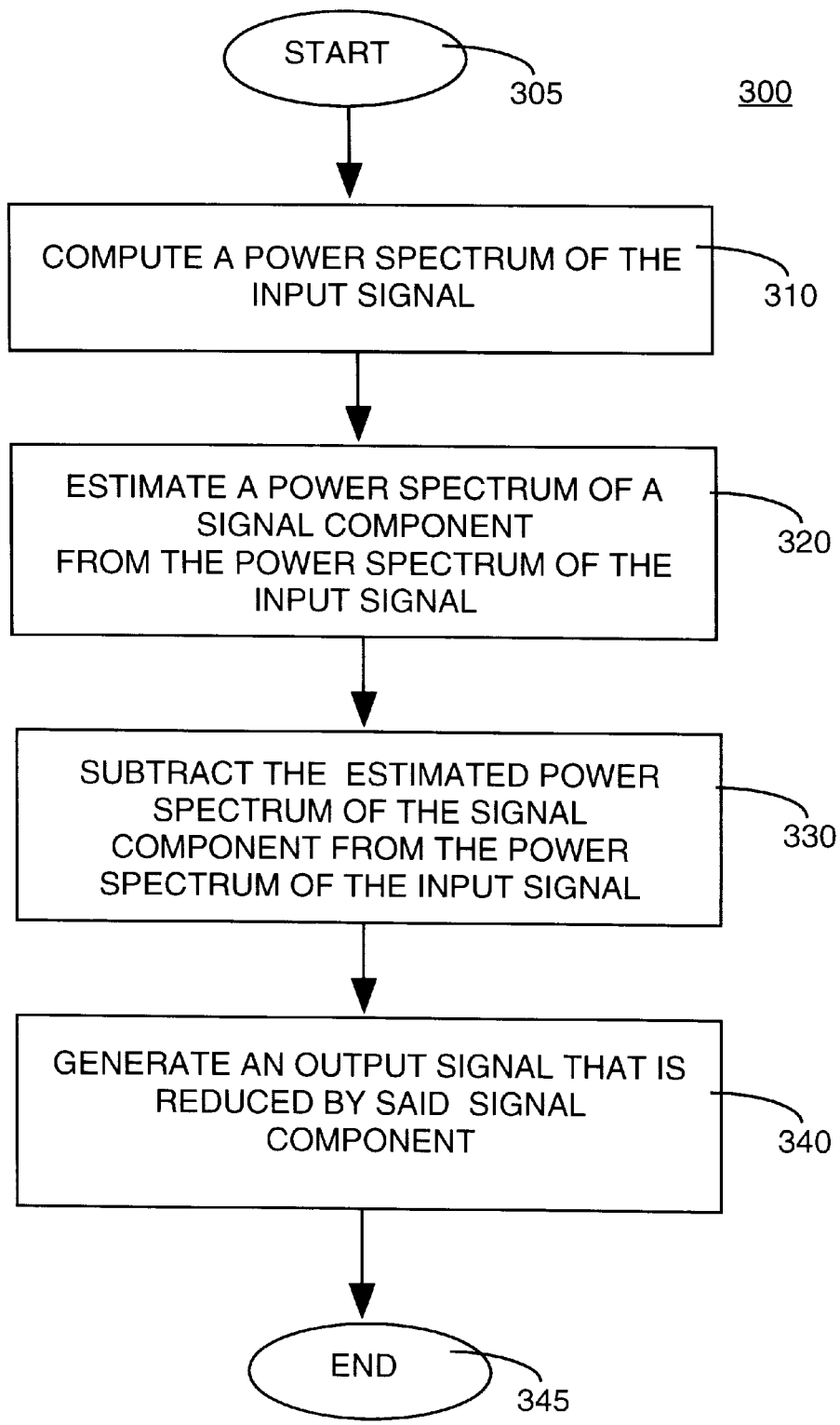
FIG. 3 depicts a flowchart of a method for generating a signal component reduced output signal.

FIG. 3 depicts a flowchart of a method 300 for generating a signal component reduced output signal. Method 300 discloses a method of estimating a power spectrum of a signal component, which is then subtracted from the power spectrum of the input signal to generate a signal component reduced output signal.

More specifically, method 300 starts in step 305 and proceeds to step 310, where a power spectrum for each frame of the input signal is generated. The power spectrum can be generated by applying a Fourier transformation and then squaring the input signal; or performing the auto-correlation on the co-variance matrix and then applying a Fourier transformation.

In step 320, method 300 estimates a power spectrum for a signal component within the input signal. This estimation is accomplished by applying a GDL filter and an appropriate detection method to the power spectrum of the input signal as illustrated in FIG. 2.

In step 330, method 300 subtracts the estimated power spectrum of the signal component from the power spectrum of the input signal. The remaining power spectrum is then applied in step 340 to generate an output signal that is reduced by the signal component. In the preferred embodiment, the signal component comprises a noise signal component, where the resulting output signal is a noise reduced speech signal. Method 300 then ends in step 345.

Figure 4:
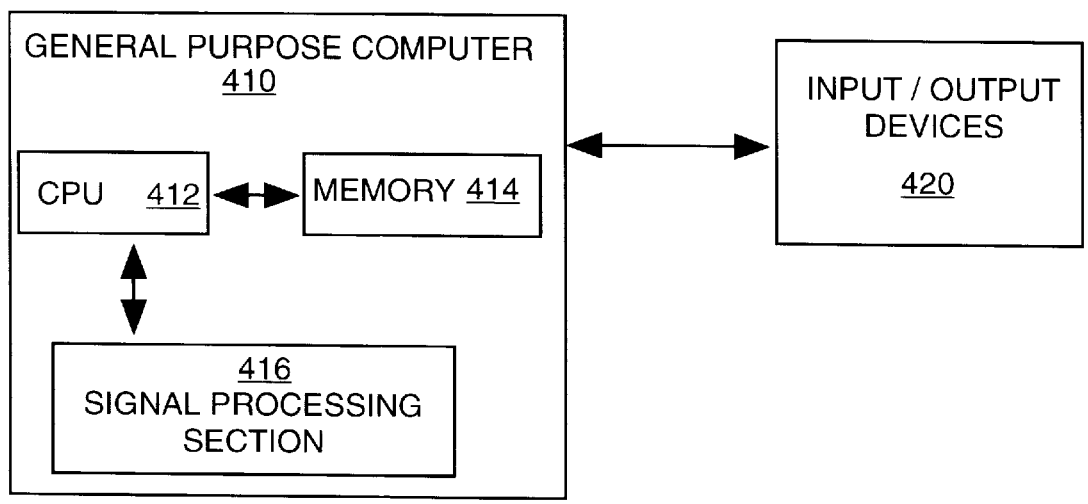
FIG. 4 depicts a block diagram of a signal processing system of the present invention which is implemented using a general purpose computer.

FIG. 4 illustrates a signal processing system 400 of the present invention. The signal processing system comprises a general purpose computer 410 and various input/output devices 420. The general purpose computer comprises a central processing unit (CPU) 412, a memory 414 and a signal processing section 416 for receiving and processing a non-stationary input signal.

In the preferred embodiment, the signal processing section 416 is simply the signal processing section 106 as discussed above in FIG. 1. The signal processing section 416 can be a physical device which is coupled to the CPU 412 through a communication channel. Alternatively, the signal processing section 416 can be represented by a software application, which is loaded from a storage medium, (e.g., a magnetic or optical drive or diskette) and resides in the memory 414 of the computer. As such, the signal processing section 106 of the present invention can be stored on a computer readable medium.

The computer 410 can be coupled to a plurality of input and output devices 420, such as a keyboard, a mouse, an audio recorder, a camera, a camcorder, a video monitor, any number of imaging devices or storage devices, including but not limited to, a tape drive, a floppy drive, a hard disk drive or a compact disk drive. In fact, various devices as discussed above with regard to the preprocessing/signal receiving section of FIG. 1 can be included among the input and output devices 420. The input devices serve to provide inputs to the computer for generating a signal component reduced output signal.

Alternatively, the present invention can also be implemented using application specific integrated circuits (ASIC).

Although various embodiments which incorporate the teachings of the present invention have been shown and described in detail herein, those skilled in the art can readily devise many other varied embodiments that still incorporate these teachings.

What is claimed is:

1. A signal processing method for generating a signal component reduced output signal from a non-stationary input signal having at least one signal component, said method comprising the steps of:
    a) determining a power spectrum for the non-stationary input signal; and
    b) estimating a power spectrum for the at least one signal component by applying a gamma delay line (GDL) filter to said power spectrum of the non-stationary input signal.

2. The method of claim 1, wherein said GDL filter comprises a plurality of first weights (w), where said plurality of first weights are adaptively updated.

3. The method of claim 2, wherein said GDL filter further comprises a plurality of second weights ($\mu$), for controlling a resolution of said GDL filter.

4. The method of claim 2, wherein said plurality of first weights are adaptively updated in accordance with a detection method, where said detection method detects a presence of the at least one signal component.

5. The method of claim 4, wherein said detection of said presence of the at least one signal component is in accordance with a power spectrum threshold.

6. The method of claim 1, further comprising the steps of:
    c) subtracting said estimated power spectrum of the at least one signal component from said power spectrum of the non-stationary input signal to produce a remaining power spectrum; and
    d) generating the component reduced output signal from said remaining power spectrum.

7. The method of claim 6, wherein said GDL filter comprises a plurality of first weights (w), where said plurality of first weights are adaptively updated.

8. The method of claim 1, wherein said non-stationary input signal is organized into at least one frame and said spectrum is determined for said at least one frame.

9. A signal processing apparatus for generating a component reduced output signal from a non-stationary input signal having at least one signal component, said apparatus comprising:

a power spectrum calculator for computing a power spectrum for the non-stationary input signal; and a gamma delay line (GDL) filter, coupled to said power spectrum calculator, for estimating a power spectrum for the at least one signal component from said power spectrum of the non-stationary input signal.

10. The signal processing apparatus of claim 9, further comprising a detection module, coupled to said GDL filter, and wherein said GDL filter comprises a plurality of first weights (w), where said plurality of first weights are adaptively updated in accordance with said detection module.

11. The signal processing apparatus of claim 10, wherein said GDL filter further comprises a plurality of second weights ($\mu$), for controlling a resolution of said GDL filter.

12. The signal processing apparatus of claim 10, wherein said detection module detects a presence of the at least one signal component.

13. The signal processing apparatus of claim 12, wherein said detection module detects said presence of the at least one signal component in accordance with a power spectrum threshold.

14. The signal processing apparatus of claim 9, further comprising:

a subtractor, coupled to said GDL filter, for subtracting said estimated power spectrum of the at least one signal component from said power spectrum of the non-stationary input signal to produce a remaining power spectrum; and a signal generator, coupled to said subtractor, for generating the component reduced output signal from said remaining power spectrum.

15. The signal processing apparatus of claim 14, further comprising a detection module, coupled to said GDL filter, and wherein said GDL filter comprises a plurality of first weights (w), where said plurality of first weights are adaptively updated in accordance with said detection module.

16. A signal processing apparatus for generating a component reduced output signal from a non-stationary input signal having at least one signal component, where said non-stationary input signal is organized into at least one frame, said apparatus comprising:

a means for computing a power spectrum for the at least one frame of the non-stationary input signal; and a gamma delay line (GDL) filtering means, coupled to said power spectrum computing means, for estimating a power spectrum for the at least one signal component from said power spectrum for the at least one frame of the non-stationary input signal.

17. The signal processing apparatus of claim 16, further comprising a detecting means, coupled to said GDL filtering means, and wherein said GDL filtering means comprises a plurality of first weights (w), where said plurality of first weights are adaptively updated in accordance with said detecting means.

18. The signal processing apparatus of claim 17, wherein said detecting means detects a presence of the at least one signal component.

19. The signal processing apparatus of claim 18, wherein said detecting means detects said presence of the at least one signal component in accordance with a power spectrum threshold.

20. The signal processing apparatus of claim 16, further comprising:

a subtracting means, coupled to said GDL filtering means, for subtracting said estimated power spectrum of the at least one signal component from said power spectrum of the non-stationary input signal to produce a remaining power spectrum; and a signal generator means, coupled to said subtracting means, for generating the component reduced output signal from said remaining power spectrum.

21. A computer-readable medium having stored thereon a plurality of instructions, the plurality of instructions including instructions which, when executed by a processor, cause the processor to perform the steps comprising of:

a) determining a power spectrum for the non-stationary input signal; and b) estimating a power spectrum for the at least one signal component by applying a gamma delay line (GDL) filter to said power spectrum of the non-stationary input signal.

22. The computer-readable medium of claim 21, wherein said GDL filter comprises a plurality of first weights (w), where said plurality of first weights are adaptively updated.

23. The computer-readable medium of claim 22, wherein said GDL filter further comprises a plurality of second weights ($\mu$), for controlling a resolution of said GDL filter.

24. The computer-readable medium of claim 22, wherein said plurality of first weights are adaptively updated in accordance with a detection method, where said detection method detects a presence of the at least one signal component.

25. The computer-readable medium of claim 21, further comprising the steps of:

c) subtracting said estimated power spectrum of the at least one signal component from said power spectrum of the non-stationary input signal to produce a remaining power spectrum; and d) generating the component reduced output signal from said remaining power spectrum.

26. The computer-readable medium of claim 21, wherein said non-stationary input signal is organized into at least one frame and said spectrum is determined for said at least one frame.

* * * * *